United States Patent [19]

Yeager

[11] 4,047,782

[45] Sept. 13, 1977

[54] ROTARY CAM LOW INSERTION FORCE CONNECTOR WITH TOP ACTUATION

[75] Inventor: Marvin Leo Yeager, Carlisle, Pa.

[73] Assignee: AMP Incorporated, Harrisburg, Pa.

[21] Appl. No.: 698,979

[22] Filed: June 23, 1976

[51] Int. Cl.[2] .......................... H01R 13/62; H05K 1/07

[52] U.S. Cl. .............................. 339/75 MP; 339/17 L; 339/176 MP

[58] Field of Search .......... 339/17 L, 17 LM, 17 LC, 339/17 M, 75 R, 75 M, 176 MP; 317/101 DH

[56] References Cited

U.S. PATENT DOCUMENTS

| | | | |
|---|---|---|---|
| 3,130,351 | 4/1964 | Giel | 317/101 DH |
| 3,299,392 | 1/1967 | Evans | 339/17 L |
| 3,853,379 | 12/1974 | Goodman et al. | 339/75 MP |

FOREIGN PATENT DOCUMENTS

| | | | |
|---|---|---|---|
| 2,333,273 | 1/1974 | Germany | 339/176 MP |

*Primary Examiner*—Roy Lake
*Assistant Examiner*—E. F. Desmond
*Attorney, Agent, or Firm*—Russell J. Egan

[57] ABSTRACT

An improved low insertion force connector assembly is described for mounting printed circuit boards and the like in a receptacle in which the contacts are cam actuated between open and closed positions to achieve a zero or low entry force. A daughter board header is attached to a daughter printed circuit board to make a two-part connector. A combination cam actuator rod and card guide is fixedly mounted on an associated equipment frame and serves to guide the circuit board into the connector receptacle. The receptacle housing of the subject connector is fixed to a mother printed circuit board and has an elongated board receiving aperture, an elongated contact drive member lying freely in the bottom of the aperture, and an elongated cam arranged to rotate between the drive member and the aperture bottom to move the former with respect to the latter. A plurality of contacts are mounted in spaced apart parallel arrangement on both elongated walls of the aperture and are moved into and out of engaging positions by the cam driven contact drive member. The daughter board header includes a like plurality of parallel spaced contacts which are fully supported on a first end to engage in the low insertion force connector and form spaced pairs of members for fixedly engaging printed contact pads on the opposite sides of a daughter printed circuit board where they are preferably soldered to the respective circuit pads. Mechanical needs are also provided to fix the daughter board header to the daughter board. The combination cam actuator rod and card guide is arranged to be secured to a portion of the equipment frame adjacent one end of the connector and includes linkages to be attached to the cam actuator portion of the low insertion force connector. Thus the printed circuit board provided with the daughter board header can be inserted into the low insertion force connector and secured therein by movement of the actuator rod from a remote location.

3 Claims, 6 Drawing Figures

ROTARY CAM LOW INSERTION FORCE CONNECTOR WITH TOP ACTUATION

BACKGROUND OF THE INVENTION

1. The Field Of The Invention

The present invention relates to a rotary cam low insertion force connector assembly which includes a low insertion force connector, a daughter board header, and a combination cam actuating rod and card guide member, the latter two being attached to the equipment frame adjacent one end of the connector.

2. The Prior Art

The low insertion force connector portion of the present assembly is described in detail in U.S. Pat. No. 3,899,234 issued Aug. 12, 1975. The present assembly is designed to incorporate the above-mentioned low insertion force connector in a two-part embodiment with an improved actuating means for remotely actuating the cam member of the connector.

An essential requirement to assure reliable operation of printed wiring boards under all environmental conditions, such as those encountered in military service, is that the boards must be thoroughly cleaned and protected with a thin conformal coating as a last step in production. Contamination can be introduced on the printed wiring board surfaces through handling, storage and exposure during operation. These contaminants may be metal particles or other conductive and ionizable materials. Also, they may be organic materials which will support fungus. The presence of these materials on the surface of the board degrades the insulation resistance, and, in the case of conductive contaminants, can result in excessive electrical leakage or shorts between conductors in the presence of moisture. The protection of the clean surface of the board by the protective coating precludes this degradation from occurring since the conductors are enveloped in the coating and contaminants can only attach themselves to the insulating surface of the coating.

Since the contact pads on the printed circuit board that mate with a one-part printed circuit receptacle cannot be comformally coated, the use of this type of connector seriously compromises the reliability of a printed circuit assembly under some environmental circumstances. Further, the one-part connector receptacle may constitute a moisture trap which could aggravate the condition.

In the past, equipment using one-part connectors has been maintained by burnishing the printed contacts and the receptacle contacts with an abrasive (No. 0000 sandpaper) to remove corrosion. When the situation became sufficiently aggravated by corrosion to preclude burnishing the contacts, the subassemblies were replaced. Since the connector portion of the printed wiring subassembly is an integral part of the conductor pattern, no corrective action is possible and the entire assembly must be scrapped. The cost of subassemblies vary considerably; however, an estimated average minimum cost of several hundred dollars is not unreasonable. Considering this, the scrapping of a subassembly because the connector cannot be replaced is intolerable.

A frequently expressed argument offered for justifying the use of the one-part connector is that of lower cost. The cost of a two-part connector should be compared to the cost of a one-part receptacle after including the additional costs imposed on the latter because of the special processing required for the plating of the printed wiring board contact tabs and for the machining of the board to assure proper initial entry and alignment of the board into the receptacle. Additional costs would also be involved to achieve more stringent dimensional and stability control of the printed wiring board base material for satisfactory life characteristics. If all these costs are considered, the differential is insignificant and, in some instances, even favors the two-part connector.

It is also desirable to have a rotary cam low insertion force connector which can be remotely operated. This is especially true for instances of high density installations with many closely spaced printed circuit boards. In such cases it is preferable to have actuating means convenient to the side of the printed circuit board remote from the connector, which means control the cam of the connector.

SUMMARY OF THE INVENTION

The subject rotary cam low insertion force connector assembly includes an elongated connector housing having an elongated opening formed therein with a plurality of contacts arranged in opposing parallel spaced relationship along opposite sides of the opening and with a contact driving member mounted for movement within the elongated aperture to open and close the contacts, a rotary cam adopted to move the connector driving member between contact open and close positions, a daughter board header adopted to be fixed to an edge of a printed circuit board, and a cam actuator rod and card guide member adopted to be mounted on an adjacent portion of the equipment frame and receive an edge of the printed circuit board extending normal to the edge having the daughter board header. The cam actuator rod is connected to the cam of the connector by a linkage or by linkages for remotely actuating the cam to thereby open and close the contacts of the connector.

It is therefore an object of the present invention to produce an improved rotary cam low insertion force connector assembly which can be operated by an actuator means at the remote edge of the mating printed circuit board.

It is another object of the present invention to produce a rotary cam low insertion force connector assembly which includes a daughter board header fixed to a printed circuit board and which is received in a low insertion force connector.

It is a further object of the present invention to produce a remote actuating system in which the position of the handle of the actuator (or lift rod) rod gives visual indication of the status of the contacts in the low insertion force connector. When the actuator rod handle is in the "up" position the contacts are known to be open. In a bank of connectors one handle in the "up" position is easily spotted so the connector can not be accidentally left open.

It is yet another object of the present invention to produce an improved rotary cam low insertion force connector assembly which can be readily and economically produced.

The foregoing and other objects of the present invention will become apparent to those skilled in the art from the following detailed description taken with reference to the accompanying drawings.

DETAILED DESCRIPTION OF THE PREFERRED EMBODIMENT

Figure 1:
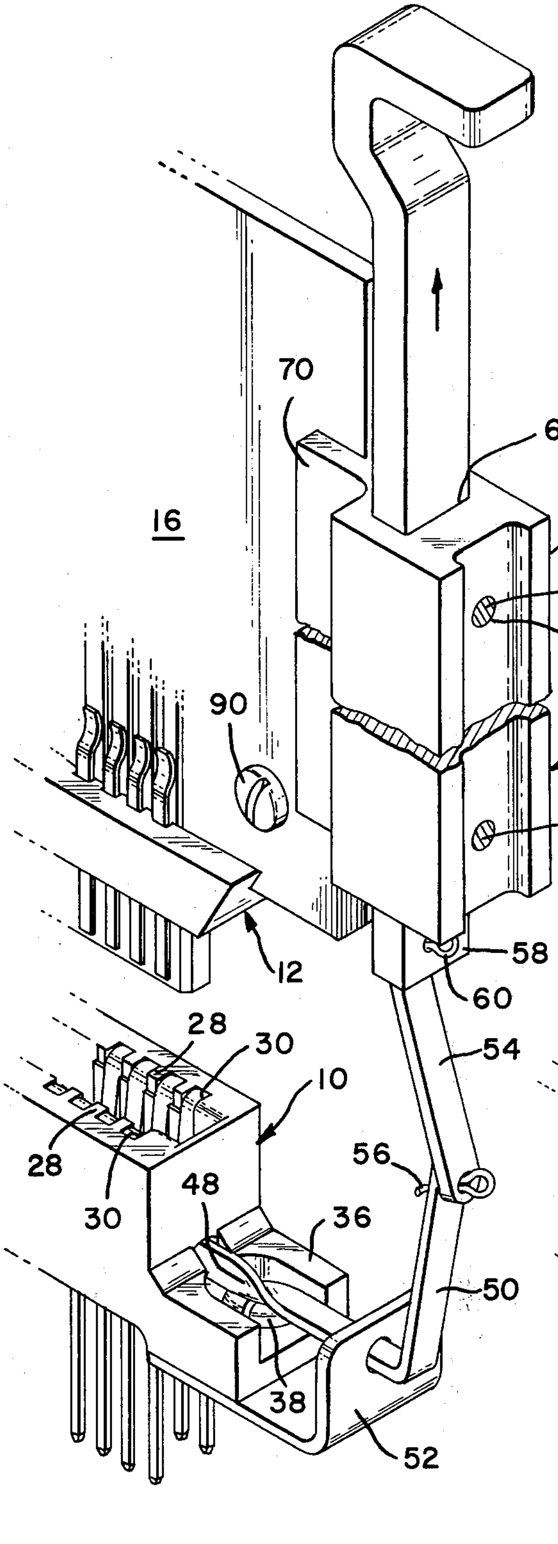
FIG. 1 is a perspective view of a portion of the subject assembly with the printed circuit board disengaged from the connector.

The subject assembly includes four primary components, namely, the low insertion force connector 10, the daughter board header 12, the combined cam actuator rod and card guide 14 and the printed circuit board 16. The connector also includes four primary components, namely, the housing 18, the cam member 20, the contact driving member 22, and a plurality of contacts 24. The housing 18 has a longitudinally extending elongated central aperture 26 in which the daughter board header 12 or circuit board 16 is received. On both sides of the aperture 26 there are a plurality of parallel spaced apart spacer members 28 which define therebetween a plurality of contact recesses 30 in which each contact 24 is received. A passage 32 extends from the end of each recess 30 through the base of the housing. A longitudinally extending cam receiving groove 34 extends centrally of the base aperture 26. The housing also includes conventional mounting flanges 36 having bores (not shown) therein for the passage for mounting means such as the bolts 38 to secure the connector 10 to a mothor board (not shown).

The contact driving member 22 has a generally channel shape with a thickened base portion 40 and two parallel spaced apart side wall portions 42, 44. The base of the member 22 lies within the groove 26 where it can be engaged by the cam member 20. The free edges of the side walls 42, 44 engage the free ends 46 of the contacts 16 to drive them to the open position shown in FIG. 4.

The cam member 20 is an elongated member adopted to pass through the cam receiving groove 34 and has a generally rectangular cross section rounded at the corners to enable it to be rotated about its longitudinal axis. A portion of the cam extends beyond the end of the housing and is both twisted about its axis at 48 and bent normal to its axis at 50 to form a crank arm. This crank arm portion preferably is supported by a support bracket 52 which is fixed to one end of the connector. The free end of the arm 50 is connected to one end of a linkage member 54 by a pin 56. The opposite end of the linkage member 54 is connected to one end of an actuator rod 58 by a pin 60.

The combination cam actuator rod and card guide 14 includes a housing 62 having a through passage 64 within which the actuator rod 58 freely moves. The housing 62 also includes mounting means (in this case bores 66 through which bolts 68 pass) for fixedly securing the housing to associated equipment framing (not shown). A pair of integral, parallel spaced flanges 70 extend from one side of the housing and form the printed circuit board or card 16 guide. A similar channel shaped guide member (not shown) would be likewise fixed to a portion of the equipment frame in parallel spaced apart relation facing the flanges 70 of the guide 14.

The daughter board header 12 includes a housing 72 having a pair of mounting tabs 74 extending from a first side thereof and a contact support tongue 76 extending from the opposite side thereof. The header is also provided with a plurality of contact passages 78 which extend through the housing on opposite sides of the tongue 76. A plurality of contacts 80 are received in the respective passages and are held therein by their locking latches 82. The contacts each include a first portion 84 adapted to both lie against the tongue 76 and engage the contacts 24 of the connector and a second portion 86 which has essentially a cantilever beam configuration. A pair of the contacts 80 will grip a daughter board 16 therebetween and be fixed to the pads thereof by conventional means, such as soldering. In the embodiment shown the contacts are formed laminated to a thin film of insulating material 88 which is wrapped around the tongue 76 before inserting the contacts 80 into their respective passages 78.

Figure 2:
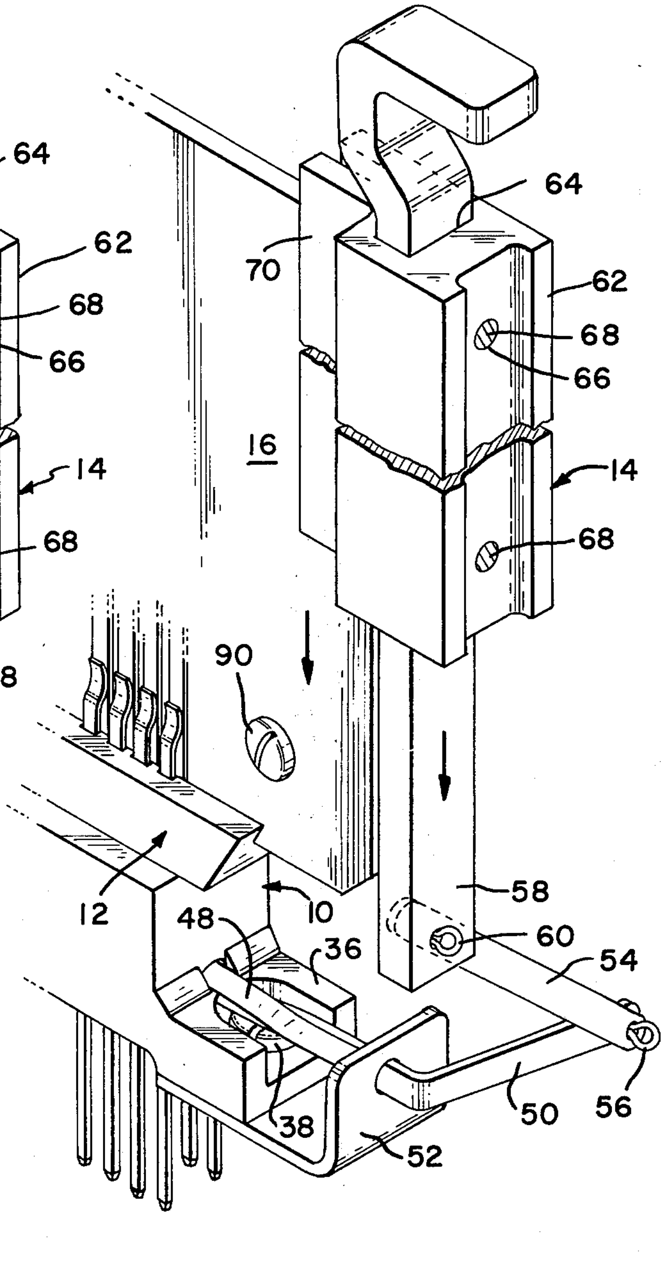
FIG. 2 is a perspective view, similar to FIG. 1, showing the printed circuit board mated in the subject assembly.
Figure 3:
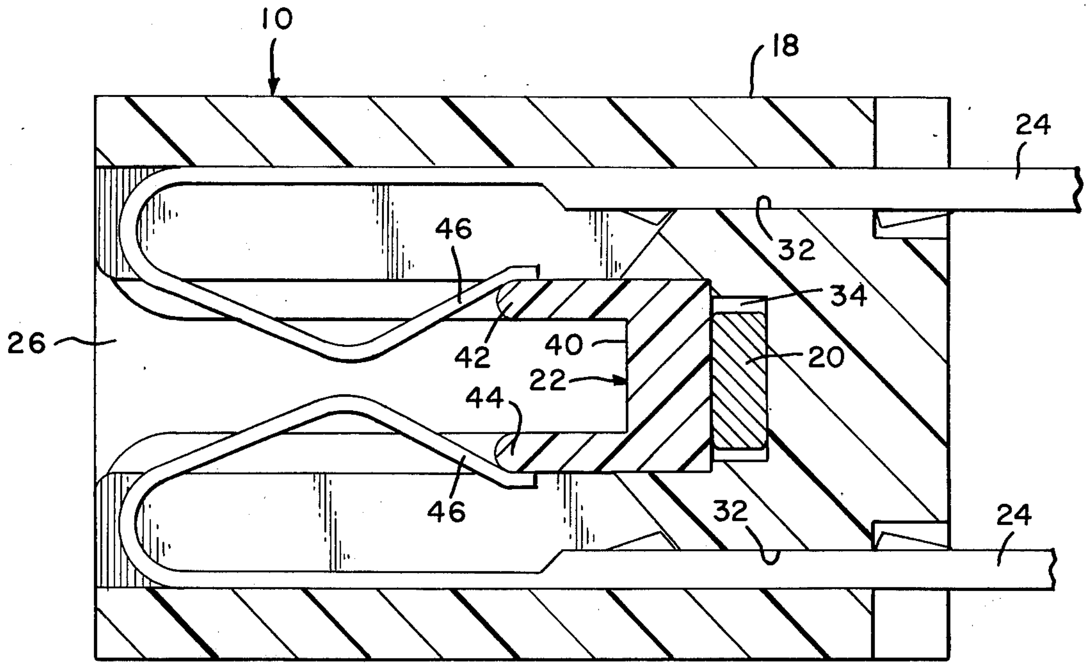
FIG. 3 is a vertical transverse section through the connector portion of the subject assembly in a first or closed condition.
Figure 4:
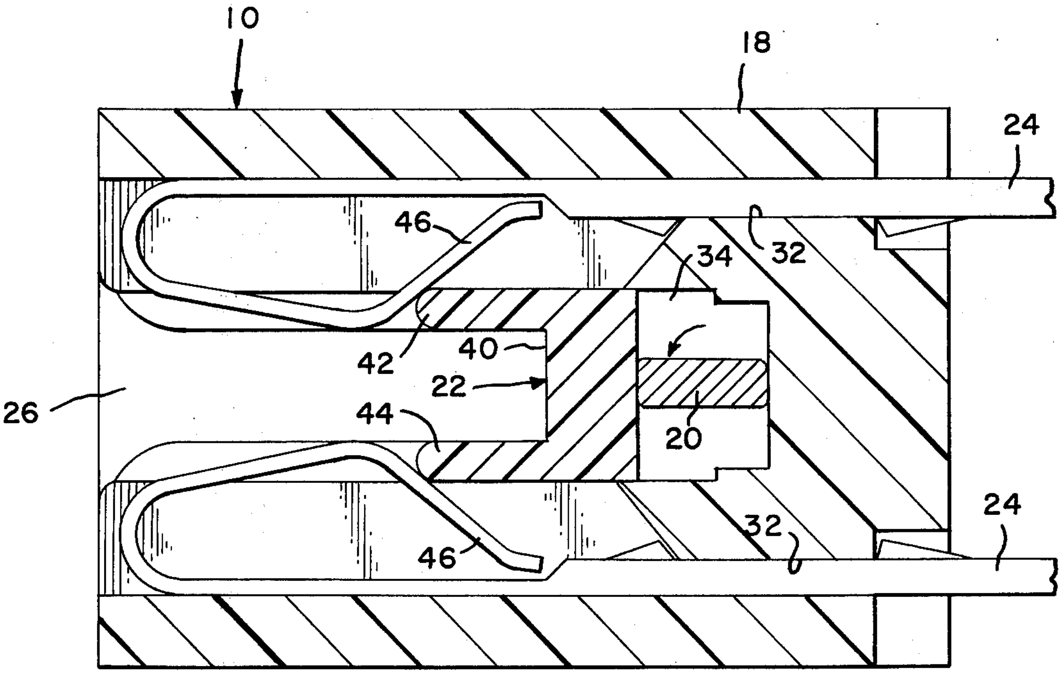
FIG. 4 is a view, similar to FIG. 3, showing the connector in a second or opened condition.
Figure 5:
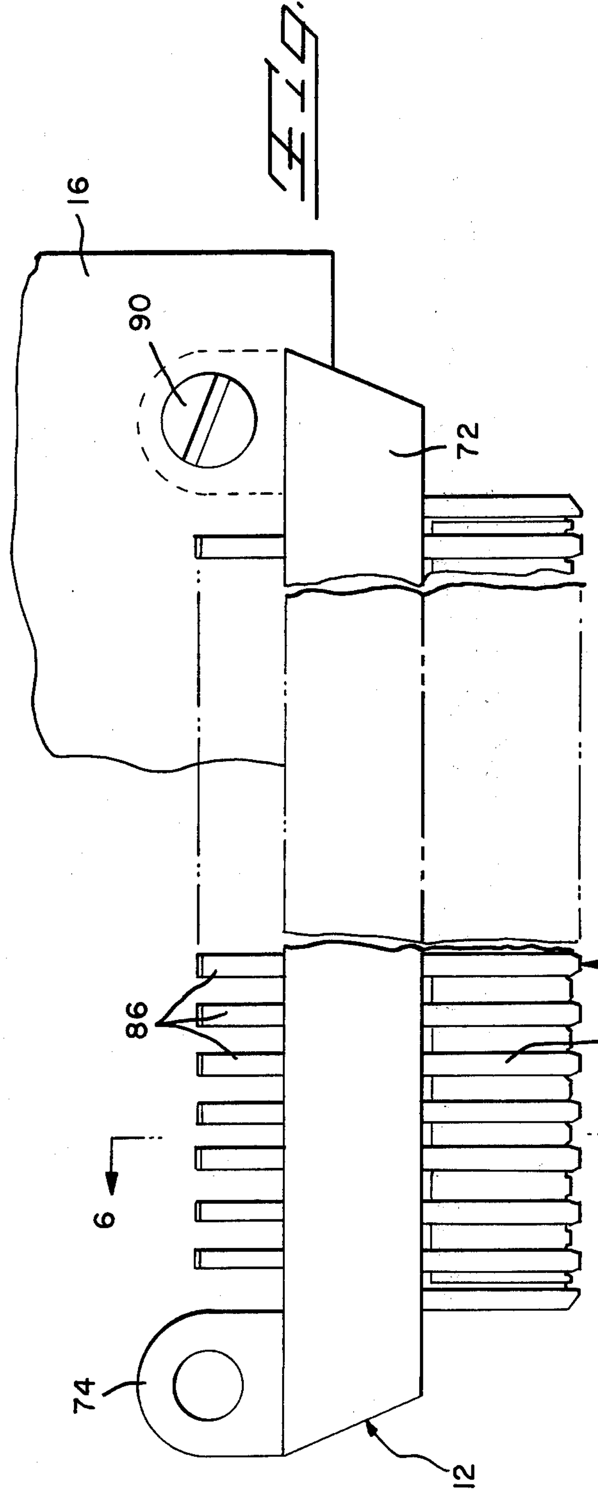
FIG. 5 is a plan view of the daughter board header with a fragment of the printed circuit board connected to the right-hand portion of the header.
Figure 6:
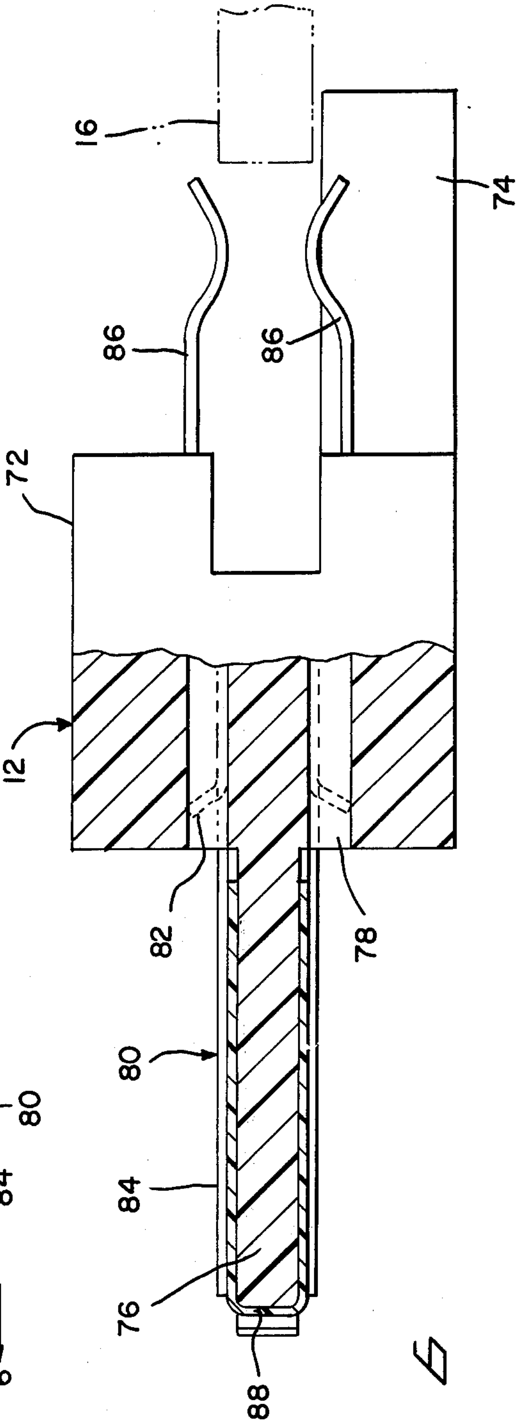
FIG. 6 is a vertical transverse section taken along line 6—6 of FIG. 5.

The assembly is operated in the following manner, first the components are completely fabricated by, for example inserting the laminated contacts 80 into the respective passages 78 of the daughter board header housing 72 and the daughter board header is assembled on the appropriate edge of the daughter printed circuit board by means of bolts 90 or the like passing through mounting tabs 74. The combined cam actuator rod and card guide is fixed to a portion of an equipment frame adjacent one end of a connector which has been loaded with contacts and secured to further equipment, such as a mother printed circuit board (not shown) by reflow soldering, for example, or the mounting means 38. The linkage member 54 would be pivotally attached to both the cam crank arm 50 by pin 56 and cam actuator rod 58 by pin 60. Pulling up on the rod 58, as shown in FIG. 1, will cause the contacts 24 in the connector 10 to be opened, as shown in FIG. 4. The daughter board is then positioned to have one edge guided by flanges 70 until the daughter board header is received into the low insertion force connector. The cam actuator rod is then depressed to cause the cam to be rotated to the position shown in FIGS. 2 and 3 to fully engage the contacts of the connector with those of the header.

An advantage of the remote actuating system is the position of the handle of the actuator (or lift rod) rod gives visual indication of the status of the contacts in the low insertion force connector. When the actuator rod handle is in the up position the contacts are known to be open. In a bank of connectors one handle in the up position is easily spotted so the connector can not be accidentally left open.

The present invention may be subject to many modifications and changes without departing from the spirit or essential characteristics thereof. The pesent embodiment is therefore intended in all respects as being illustrative and non-restrictive of the scope of the invention.

What is claimed is:

1. A remotely actuated, rotary cam operated, low insertion force, edge board connector assembly for electrically and mechanically engaging a printed circuit board, said assembly comprising:

a printed circuit board header having a housing with at least one elongated printed circuit board receiving groove along one side edge thereof, at least one mounting tab extending from said one side adjacent said groove, a mounting tongue extending from an opposite side of said housing, a plurality of contact receiving passages extending through said housing on opposite sides of said tongue and said groove, a like plurality of contacts each received in a respective one of said passages with a first end supported by said tongue and a second end adopted to engage against contact pads of a printed circuit board received in said groove, and latch means engaging said housing to hold said contacts in position, and mounting means securing said printed circuit board to each said at least one mounting tab;

a low insertion force edge board connector having an elongated housing with an elongated recess for receiving said printed circuit board header therein, a plurality of contacts disposed in said housing in parallel spaced relationship on opposite sides of said elongated recess, a contact actuator member positioned in said recess to act against said contacts to move them between first and second positions in which they respectively engage and disengage said contacts of said printed circuit board header received therebetween, and rotary cam means adapted to drive said contact actuator member between said first and said second positions;

printed circuit board guide means in fixed relationship to said connector and adapted to guide said board during insertion into and withdrawal from said connector, said guide means including a pair of channel-shaped guide housing members each in fixed relation to a respective end of said connector housing, each said guide housing member extending normal to the elongated axis of said connector housing aligned with and opening in the direction of said recess, and a passageway through one of said guide housing members; and remote cam actuating means movably mounted in said passageway, and including an axially moving actuator rod, and linkage means connecting one end of said actuator rod to the rotary cam of said connector whereby said rotary cam can be actuated from a position remote from said connector.

2. A rotary cam actuated low insertion force connector assembly according to claim 1 wherein:

said second end of each said contact is soldered to a respective contact pad of said printed circuit board.

3. A two-piece rotary cam actuated low insertion force connector assembly comprising:

a connector member including an elongated housing having an elongated recess adapted to receive a printed circuit board therein, a plurality of contacts disposed in said housing in parallel spaced relationship on opposite sides of said elongated recess, a contact actuator member received in said recess and adapted to act against said contacts to move them between first and second positions in which they respectively engage and disengage a printed circuit board received therebetween, and rotary cam means adapted to drive said contact actuator member between said first and said second positions; and a daughter printed circuit board header including:

a housing having at least one printed circuit board receiving groove along one side edge thereof and at least one mounting tab extending from said one side adjacent said groove and adopted to receive means securing said printed circuit board thereto, a mounting tongue extending from an opposite side of said housing, and a plurality of contact receiving passages extending through said housing on opposite sides of said tongue and said groove; and a plurality of contacts each received in a respective one of said passages with a first end supported by said tongue and a second end adopted to engage against a printed circuit board received in said groove, and latch means engaged in said housing to hold said contacts in position.

* * * * *